US012363876B2

(12) United States Patent  
Chen

(10) Patent No.: US 12,363,876 B2  
(45) Date of Patent: Jul. 15, 2025

(54) VERTICAL CLAMPING SUBSTRATE JIG

(71) Applicant: GROUP UP INDUSTRIAL CO., LTD., Taoyuan (TW)

(72) Inventor: An-Shun Chen, Taoyuan (TW)

(73) Assignee: GROUP UP INDUSTRIAL CO., LTD., Taoyuan (TW)

( * ) Notice: Subject to any disclaimer, the term of this patent is extended or adjusted under 35 U.S.C. 154(b) by 325 days.

(21) Appl. No.: 18/112,478

(22) Filed: Feb. 21, 2023

(65) Prior Publication Data

US 2024/0081033 A1 Mar. 7, 2024

(30) Foreign Application Priority Data

Sep. 2, 2022 (TW) .................................. 111133352

(51) Int. Cl.
H05K 13/00 (2006.01)

(52) U.S. Cl.
CPC ................................ *H05K 13/0069* (2013.01)

(58) Field of Classification Search
CPC ............ Y10S 269/903; H05K 13/0069; H05K 13/0076
USPC ...................................... 269/46, 47, 903, 305
See application file for complete search history.

(56) References Cited

U.S. PATENT DOCUMENTS

| | | | | |
|---|---|---|---|---|
| 4,874,081 A * | 10/1989 | Kondo | ............... | H05K 13/0061 198/817 |
| 5,048,268 A * | 9/1991 | Brembilla | ................. | B65B 9/04 53/511 |
| 5,145,055 A * | 9/1992 | Kondo | ................... | B65G 17/26 198/817 |
| 6,824,343 B2 * | 11/2004 | Kurita | ............... | H01L 21/68778 414/217 |
| 8,950,594 B2 * | 2/2015 | Moon | ..................... | B25B 5/108 211/175 |
| 9,609,794 B2 * | 3/2017 | Endress | ................. | B23K 1/008 |
| 11,505,861 B2 * | 11/2022 | Kaneko | ................. | H01L 21/683 |
| 2004/0090747 A1 * | 5/2004 | Wang | ................ | H05K 13/0069 361/719 |

* cited by examiner

*Primary Examiner* — Jason L Vaughan

(57) ABSTRACT

A vertical clamping substrate jig includes a jig body including an upper frame plate, a lower frame plate, a first side frame plate and a second side frame plate and the upper frame plate, the first side frame plate and the second side frame plate each having two through holes, a plurality of fixing structures set next to the through holes respectively, a plurality of clamping members respectively set on the upper frame plate, the first side frame plate and the second side frame plate, and supporting members used to support the upright flexible substrate that has a thickness in between 0.2 mm to 3 mm. Each clamping member has one end thereof connected to one respective fixing structure, an opposite end terminating in a clamping end, and an elastic portion on the middle between the two ends.

11 Claims, 14 Drawing Sheets

VERTICAL CLAMPING SUBSTRATE JIG

BACKGROUND OF THE INVENTION

1. Field of the Invention

The present invention relates to a clamping jig, especially a vertical clamping substrate jig to handle fragile substrate and vertically transfers inside the tool and through out the whole curing process.

2. Description of the Related Art

With the development of electronic products towards high performance and small size, traditional printed circuit boards with single-layer circuits have been unable to meet the current demand for high-density wiring. Therefore, today's printed circuit boards have developed into a multi-layer circuit structure to meet the multi-functional high wiring density of electronic products and the purpose of reducing the area of the circuit board.

The fragile flexible sheets used under the current advanced process are getting thinner and thinner, for example, the thickness is only 0.2 mm to 3 mm. The fragile flexible sheet is easily to be broken or deformed when it is transferred, and the fragile flexible sheet must also go through the drying process of the baking oven during the production process. Under this high temperature process, it is also easy to break or deform the fragile flexible sheet due to thermal expansion, and vibration which will reduce production efficiency and yield rate of production. Thus invention of special jig for special fragile flexible sheet is essential.

SUMMARY OF THE INVENTION

The present invention provides a vertical clamping substrate jig for vertically clamping a fragile flexible substrate having a thickness in between 0.2 mm to 3 mm and transferring the flexible substrate vertically through a tool end of a transfer device. The vertical clamping substrate jig comprises a jig body, a plurality of fixing structures, a plurality of clamping members at least one supporting member. The jig body comprises an upper frame plate, a lower frame plate, a first side frame plate and a second side frame plate. The first side frame plate and the second side frame plate are respectively connected to both ends of the upper frame plate and the lower frame plate, so that a central portion of the jig body is hollow. Each of four corners of the central portion is provided with a first arc-shaped groove. The upper frame plate, the first side frame plate and the second side frame plate each have at least one through hole. The fixing structures are correspondingly disposed beside the through holes. Each fixing structure has two ends thereof respectively provided with a stop portion. The clamping members are respectively arranged on the upper frame plate, the first side frame plate and the second side frame plate. Each clamping member has one end thereof connected to one respective fixing structure, an opposite end thereof terminating in a clamping end and an elastic portion on the middle between the two ends. The clamping members are used to jointly clamp the flexible substrate in vertical. The at least one supporting member is respectively disposed on the lower frame plate through one respective locking member. The at least one supporting member is used to support the fragile flexible substrate in vertical.

In one embodiment of the present invention, the through holes are respectively for a respective push rod to pass through the through holes and push the clamping members.

In one embodiment of the present invention, the fixing structures are fixed with the upper frame plate, the first side frame plate and the second side frame plate through the corresponding locking members.

In one embodiment of the present invention, the central body of the fixing structure is connected to the clamping member, and the central body does not cover the corresponding through hole.

In one embodiment of the present invention, the central body of the fixing structure is connected to the clamping member, and an extended body part of the central body covers the corresponding part of the through hole, and a spring piece is set on the central body, and the spring piece makes the extended body part return to its original shape after being subjected to external force.

In one embodiment of the present invention, the clamping ends of the clamping members are used to contact and clamp the fragile flexible substrate, and the material of the clamping ends is selectively ceramic, metal alloy, quartz or glass.

In one embodiment of the present invention, the both ends of the upper frame plate have a respective upper hanging portion.

In one embodiment of the present invention, the first side frame plate and the second side frame plate each have an outer extending section provided with an insertion portion and a lower hanging portion. Each of the lower hanging portions is formed outside the respective insertion portion.

In one embodiment of the present invention, each insertion portion is inserted and hung by the tool end of the transfer device to transport the flexible substrate.

In one embodiment of the present invention, the lower frame plate has at least one second arc-shaped groove.

In one embodiment of the present invention, the vertical clamping substrate jig further comprises a plurality of positioning members arranged on the first side frame plate and the second side frame plate.

To sum up, the vertical clamping substrate jig disclosed by the present invention can achieve the following effects:
1. Place and handle the fragile flexible substrate in vertical to avoid cracking or deformation.
2. Use material with substantially the same expansion and thermal conductivity as the fragile flexible substrate to avoid cracking or deformation during high temperature process.
3. Under the advanced process, the flexible substrate can be transferred in batches and the baking and heating process can be performed.

The following describes in detail through a specific embodiment, so that it is easier to understand the purpose, technical content and characteristics of the present invention and the effect it achieved.

DETAILED DESCRIPTION OF THE PREFERRED EMBODIMENT

In order to solve the problems related to handling fragile flexible substrates with a thickness of only 0.2 mm to 3 mm for high temperature processes under the existing advanced process, after years of research and development, the inventor has improved the criticism of the existing products. The following will introduce in detail how the present invention uses a vertical clamping substrate jig to achieve the most efficient functional demands.

First Embodiment

Figure 1A:
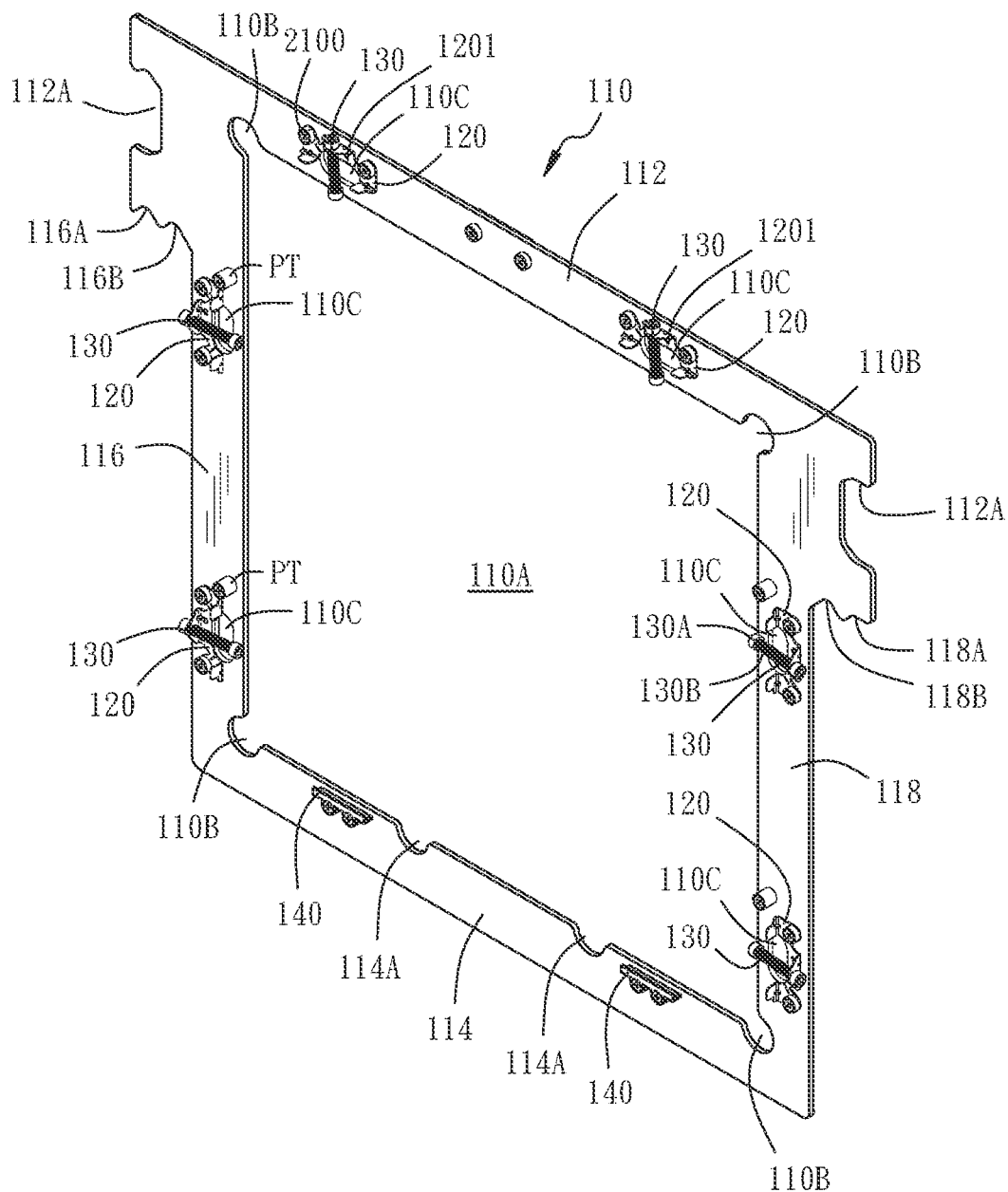
FIG. 1A is the schematic diagram of the first embodiment of the vertical clamping substrate jig of the present invention.
Figure 2A:
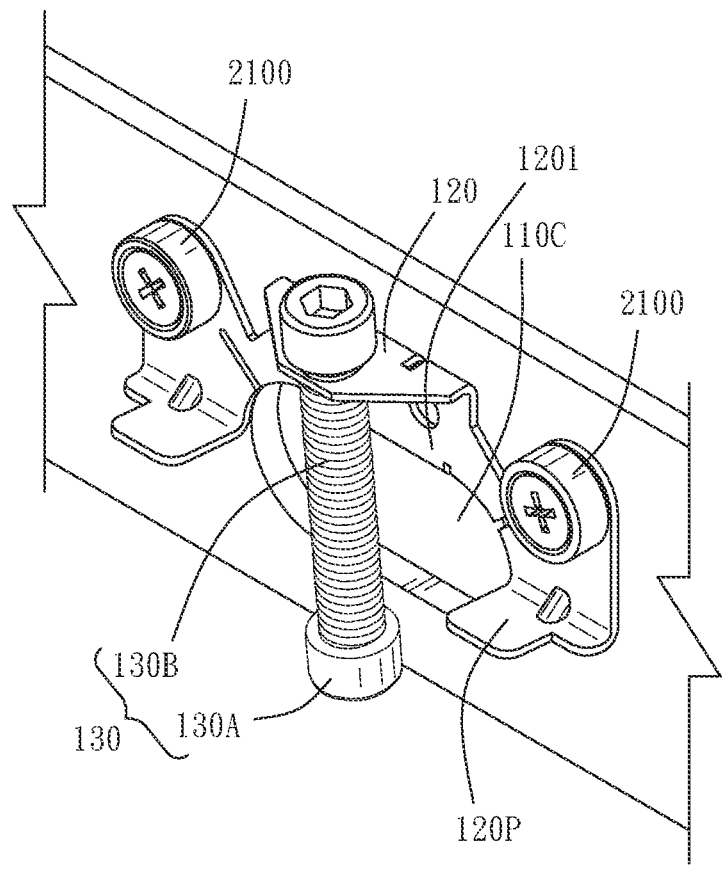
FIG. 2A is the schematic diagram of the first embodiment of the fixing structure and clamping member of the present invention.
Figure 3A:
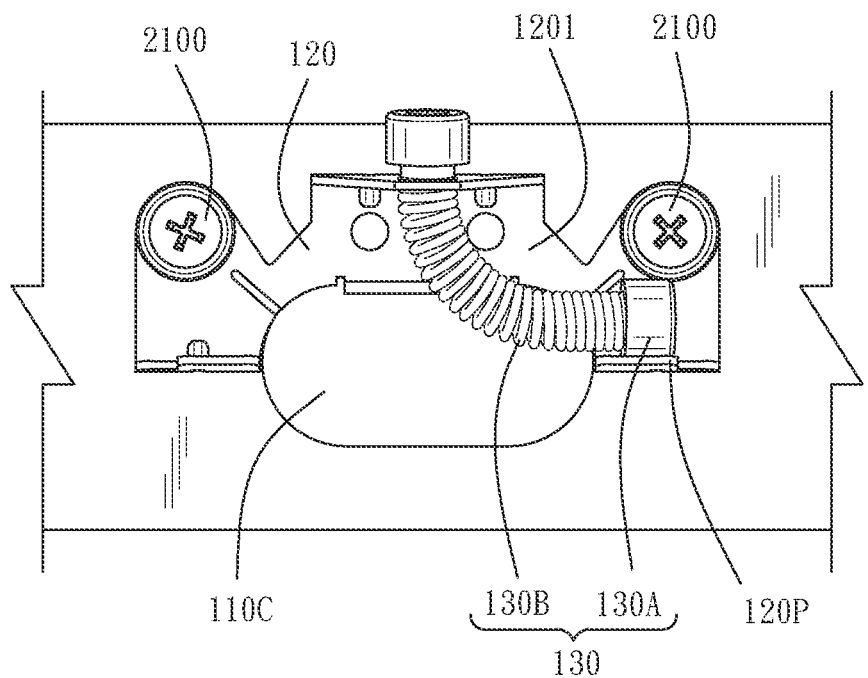
FIG. 3A is a schematic diagram of placing the clamping end of the clamping member of the first embodiment of the present invention in the groove.
Figure 4A:
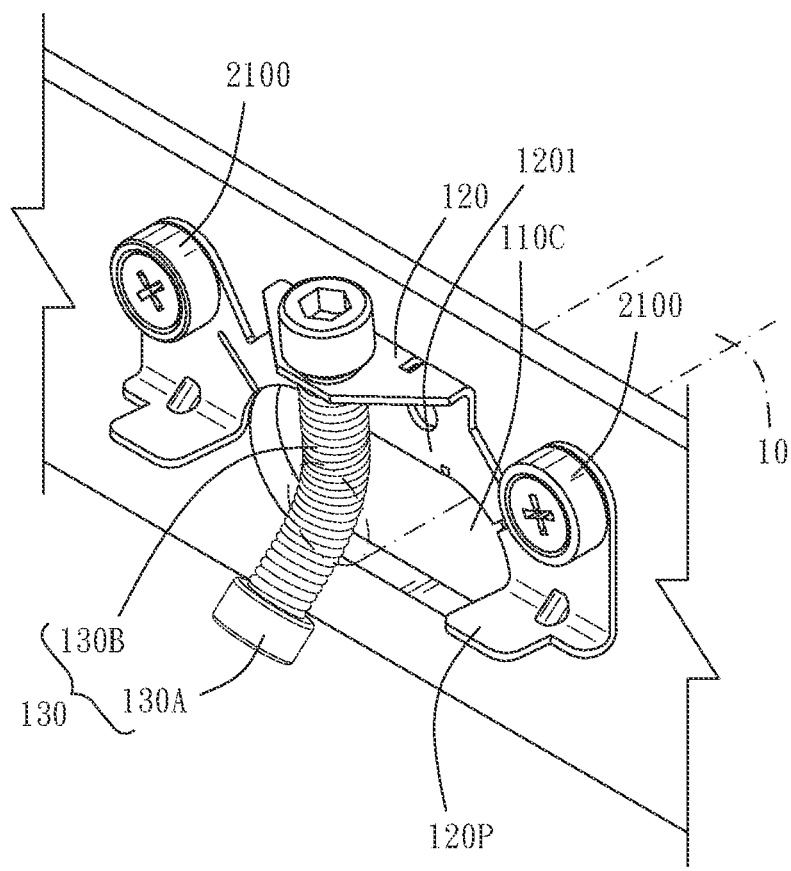
FIG. 4A is a schematic diagram of the first embodiment of the present invention using a push rod to pass through the through hole and push the clamping member.
Figure 5A:
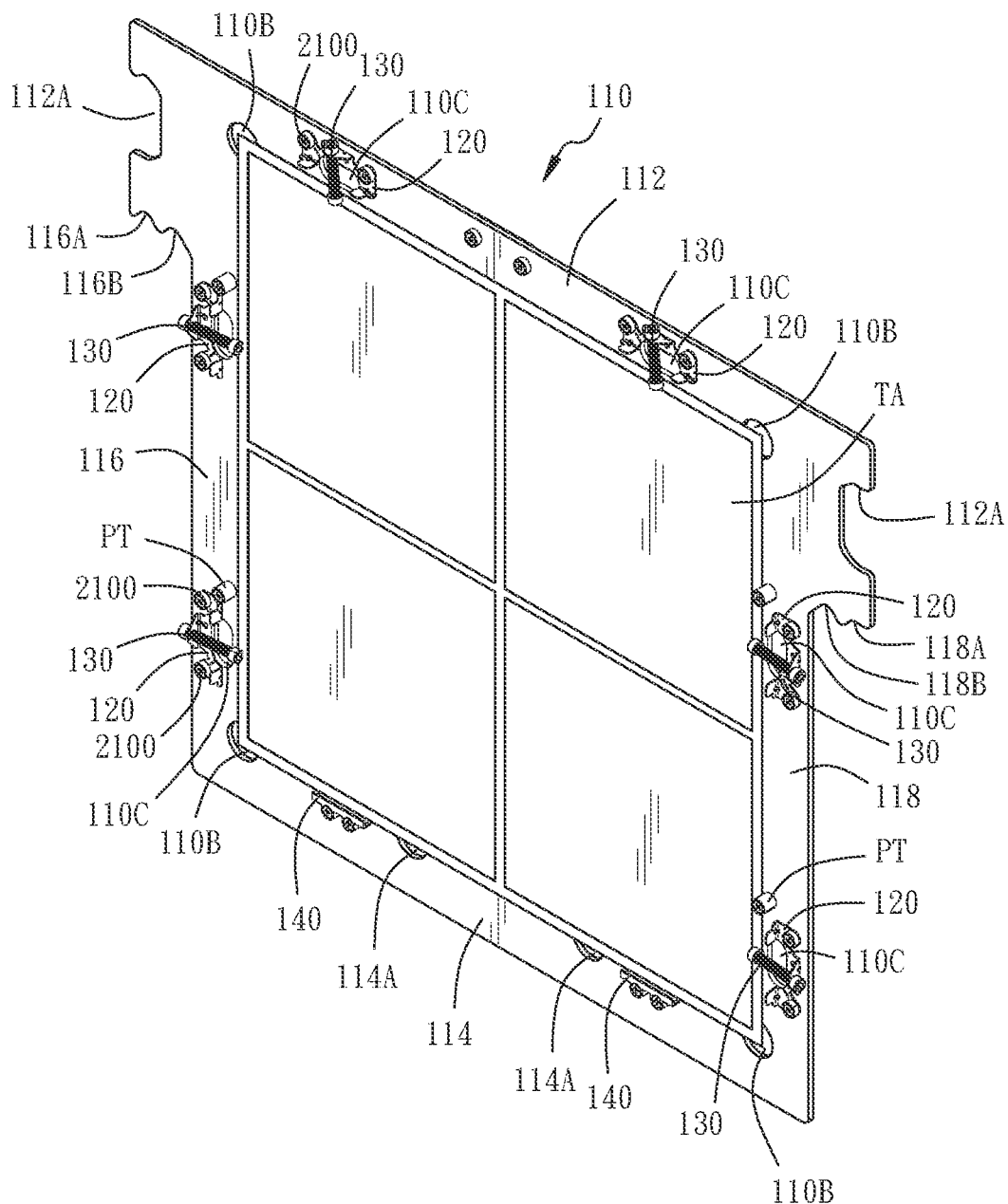
FIG. 5A is a schematic diagram of the vertical clamping substrate jig of the first embodiment of the present invention clamping the fragile flexible substrate.
Figure 6A:
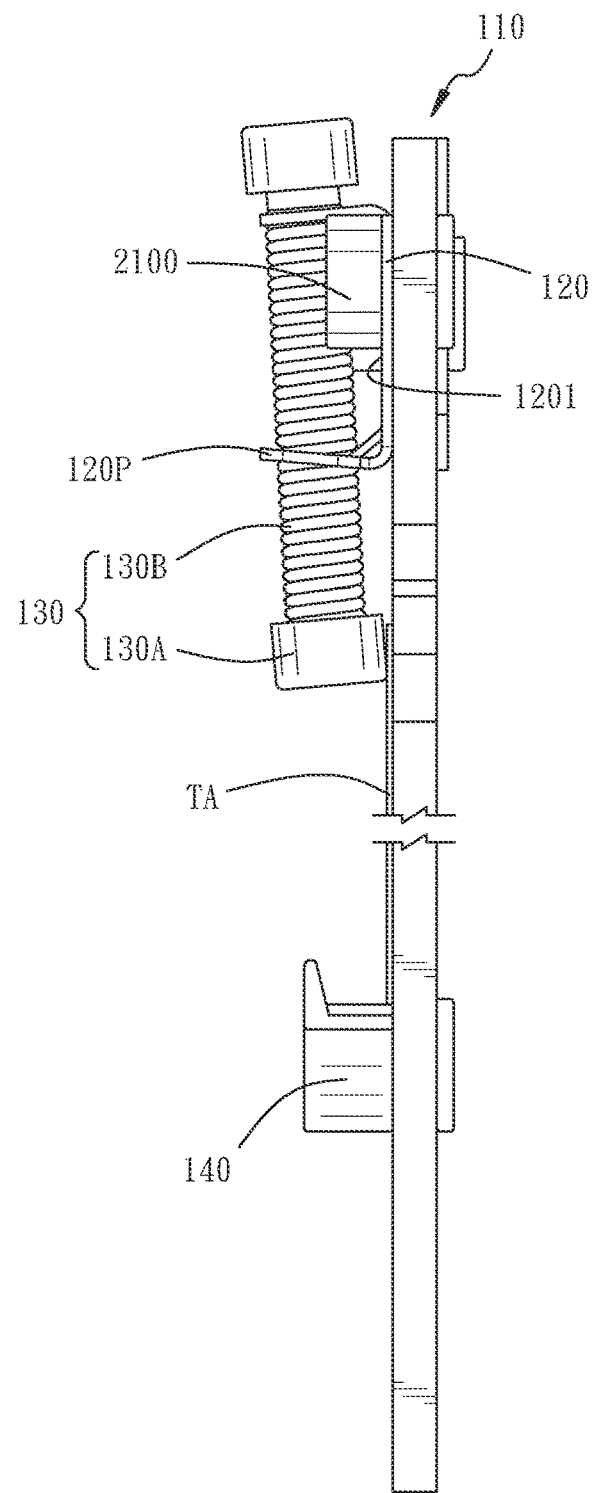
FIG. 6A is a side view of the vertical clamping substrate jig of the first embodiment of the present invention clamping the fragile flexible substrate.

Please refer to FIGS. 1A, 2A, 3A, 4A, 5A and 6A, where FIG. 1A is the schematic diagram of the first embodiment of the vertical clamping substrate jig of the present invention, FIG. 2A is the schematic diagram of the first embodiment of the fixing structure and clamping member of the present invention, FIG. 3A is a schematic diagram of placing the clamping end of the clamping member of the first embodiment of the present invention in the groove, FIG. 4A is a schematic diagram of the first embodiment of the present invention using a push rod to pass through the through hole and push the clamping member, FIG. 5A is a schematic diagram of the vertical clamping substrate jig of the first embodiment of the present invention clamping the fragile flexible substrate, and FIG. 6A is a side view of the vertical clamping substrate jig of the first embodiment of the present invention clamping the fragile flexible substrate. Since the thickness of the flexible substrate TA under the advanced manufacturing process is only 0.2 mm to 3 mm, if the fragile flexible substrate TA is transferred by the horizontal and flat type, the flexible substrate TA will break or deform. Therefore, the vertical transfer method is a very necessary condition. As shown in the drawings, the content of the present invention discloses a vertical clamping substrate jig 100, which is especially suitable for clamping a fragile flexible substrate TA in an upright manner, and performing upright transfer through the tool end of the transfer device. The fragile flexible substrate TA can be a flexible circuit board, a flexible substrate or a glass sheet, but not limited to these three. The vertical clamping substrate jig 100 comprises a jig body 110, a plurality of fixing structures 120, a plurality of clamping members 130, at least one supporting member 140 and a plurality of positioning members PT. The entire jig body 110 is made of non-metallic materials, and the jig body 110 comprises an upper frame plate 112, a lower frame plate 114, a first side frame plate 116 and a second side frame plate 118. The first side frame plate 116 and the second side frame plate 118 are respectively connected to both ends of the upper frame plate 112 and the lower frame plate 114, so that the central portion 110A of the jig body 110 is hollow. The four corners of the central portion 110A each have a first arc-shaped groove 110B. The upper frame plate 112, the first side frame plate 116 and the second side frame plate 118 each have at least one through hole 110C. In addition, the lower frame plate 114 has at least one second arc-shaped groove 114A. In the embodiment of the present invention, the lower frame plate 114 has two second arc-shaped grooves 114A. The fixing structures 120 are correspondingly disposed beside the through holes 110C (but do not cover the through holes 110C), wherein the central body 1201 of the fixing structure 120 is connected to one end of the clamping member 130, and the central body of the fixing structure 120 does not cover the corresponding through hole 110C. The two ends of each fixing structure 120 are respectively provided with a stop portion 120P. In this embodiment, the appearance of the stop portion 120P is L-shaped, but it is not limited to L-shaped.

The fixing structures 120 are fixed with the upper frame plate 112, the first side frame plate 116 and the second side frame plate 118 through the corresponding locking members 2100. Both ends of the upper frame plate 112 have upper hanging portions 112A respectively. The outer extending sections of the first side frame plate 116 and the second side frame plate 118 have insertion portions 116B and 118B and lower hanging portions 116A and 118A, respectively. Each of the lower hanging portions 116A and 118A is formed on the outer side of each of the insertion portions 116B and 118B.

The clamping members 130 are respectively arranged on the upper frame plate 112, the first side frame plate 116 and the second side frame plate 118. One end of the clamping members 130 is respectively connected to the fixing structures 120 and the other end is the clamping end 130A. The middle section of the clamping members 130 is an elastic portion 130B. The clamping members 130 are mainly used to jointly clamp the vertical flexible substrate TA, and in this embodiment of the present invention, the thickness of the flexible substrate TA is 0.2 mm to 3 mm. Also, in this embodiment, the elastic portion 130B may be a spring. In this embodiment, the clamping ends 130A of the clamping members 130 are used to contact and clamp the flexible substrate TA, and the material of the clamping ends 130A is ceramic, metal alloy, quartz or glass. Furthermore, as shown in FIG. 4A, in the first embodiment, the flexible substrate TA can be pushed out through the through holes 110C by using the push rods 10 and pushing up a plurality of clamping members 130 to bend upwards, so that the flexible substrate TA can be placed on the vertical clamping substrate jig 100. After that, the push rods 10 exit the through holes 110C so that multiple clamping members 130 can clamp the flexible substrate TA, as shown in FIG. 5A. It is worth mentioning that, in order to know immediately whether the elastic portion 130B of the clamping member 130 is normal, the push rods 10 are further equipped with a pressure sensor (not shown). When the push rods 10 are used to pass through the through hole 110C and push multiple clamping members 130, the pressure sensor will feel the recovery force of the elastic portion 130B to judge whether the elastic force of the elastic portion 130B is normal. Once the pressure sensor senses that the elasticity of the elastic portion 130B is abnormal, it will notify the management personnel to replace it, so as to avoid the problem that the clamping members 130 cannot clamp the flexible substrate TA.

In addition, the above-mentioned supporting members 140 are locked through the locking members 210 and arranged on the lower frame plate 114. The supporting members 140 are used to support the upright flexible substrate TA, as shown in FIG. 6A.

Second Embodiment

Figure 1B:
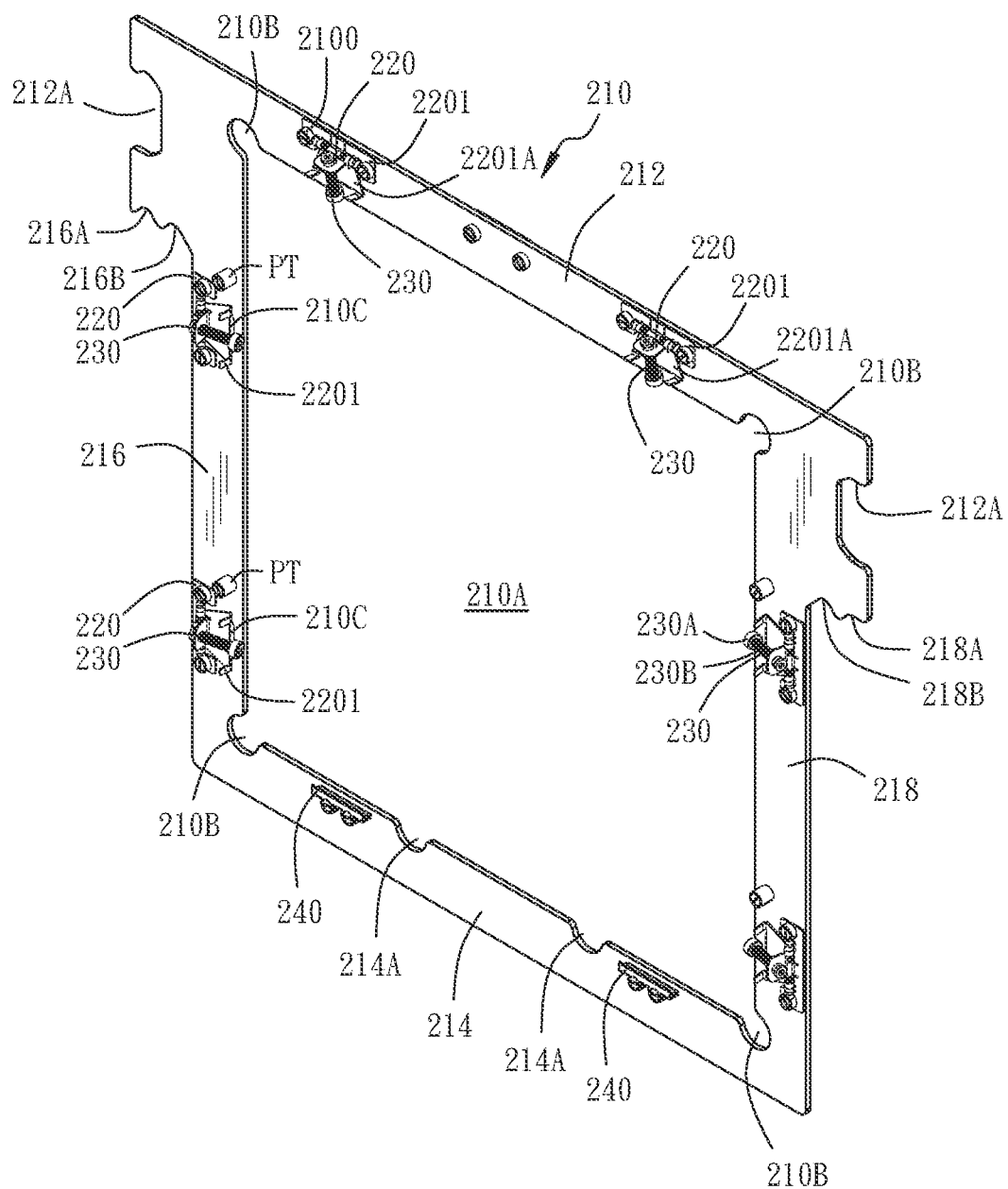
FIG. 1B is the schematic diagram of the second embodiment of the vertical clamping substrate jig of the present invention.
Figure 2B:
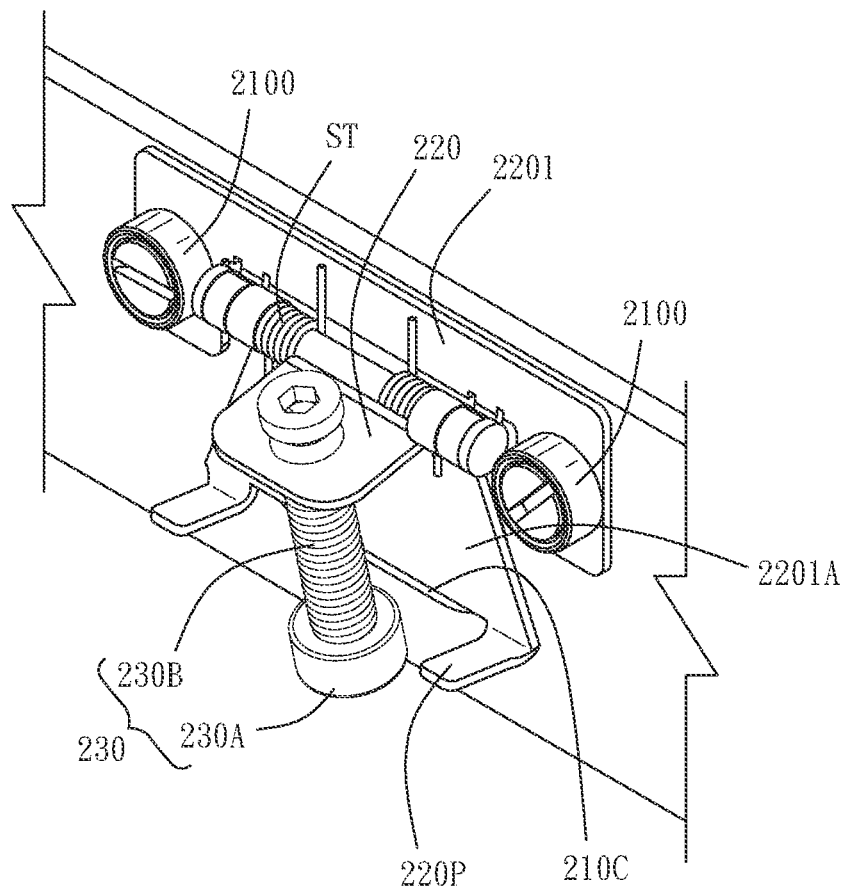
FIG. 2B is the schematic diagram of the second embodiment of the fixing structure and clamping member of the present invention.
Figure 3B:
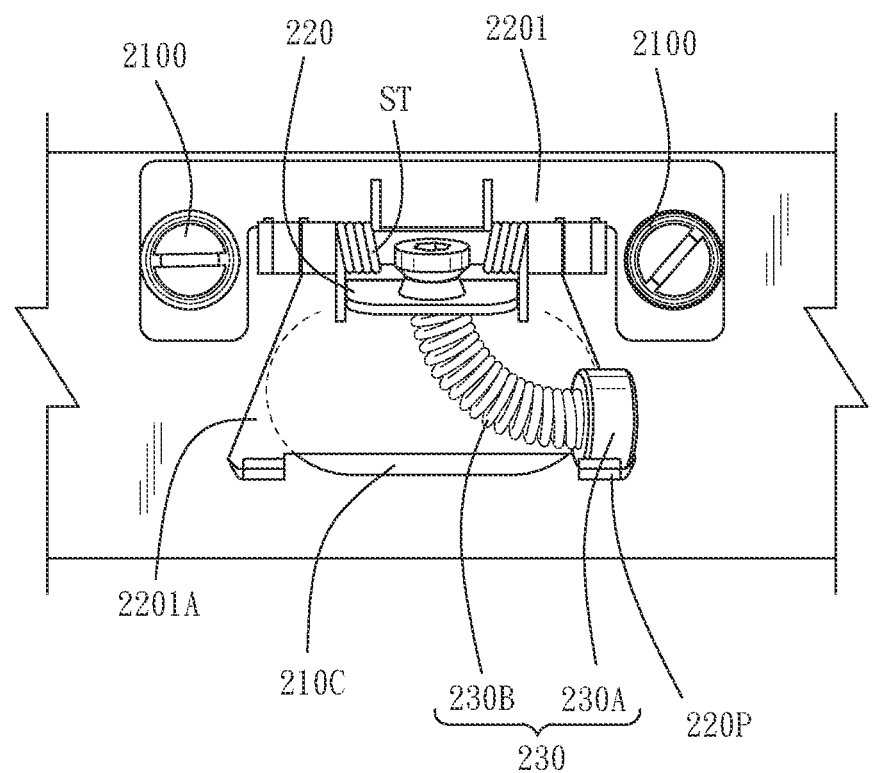
FIG. 3B is a schematic diagram of placing the clamping end of the clamping member of the second embodiment of the present invention in the groove.
Figure 4B:
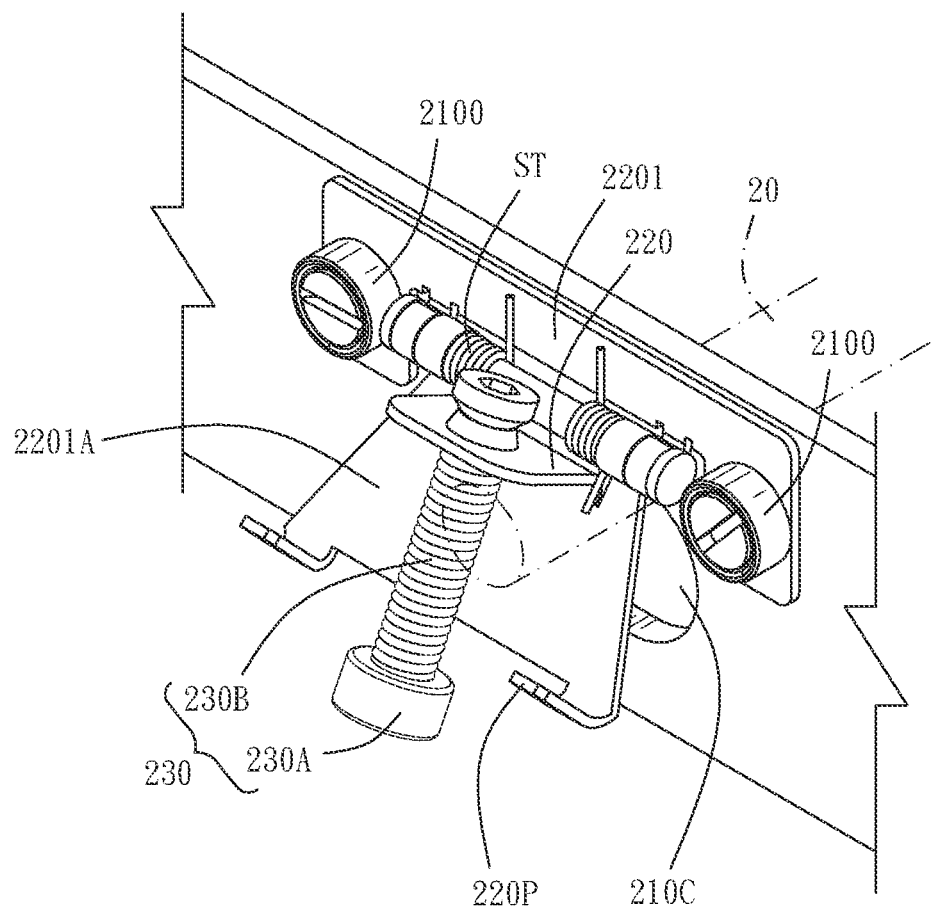
FIG. 4B is a schematic diagram of the second embodiment of the present invention using a push rod to push the extended body part and then push the clamping member.
Figure 5B:
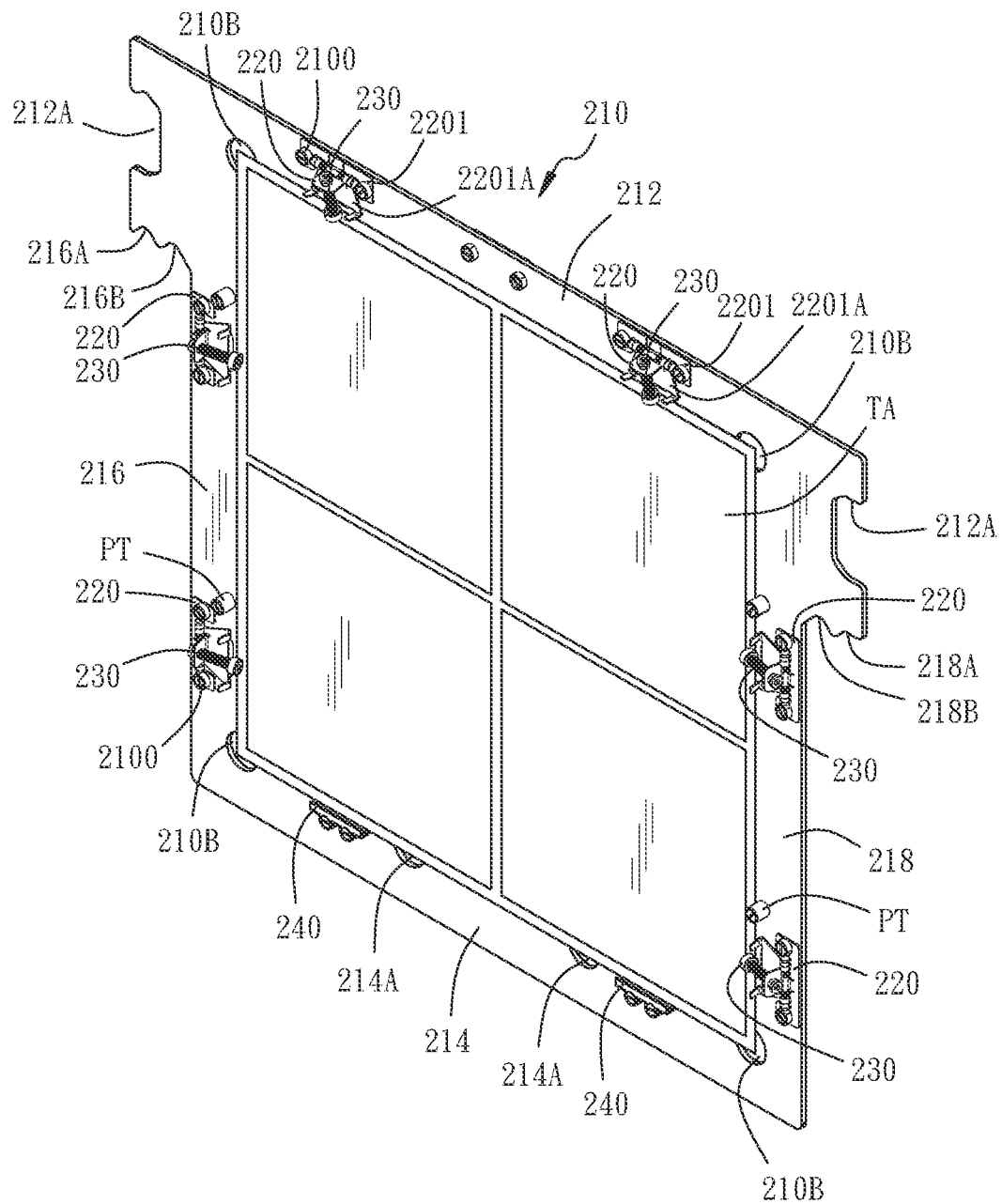
FIG. 5B is a schematic diagram of the vertical clamping substrate jig of the second embodiment of the present invention clamping the fragile flexible substrate.
Figure 6B:
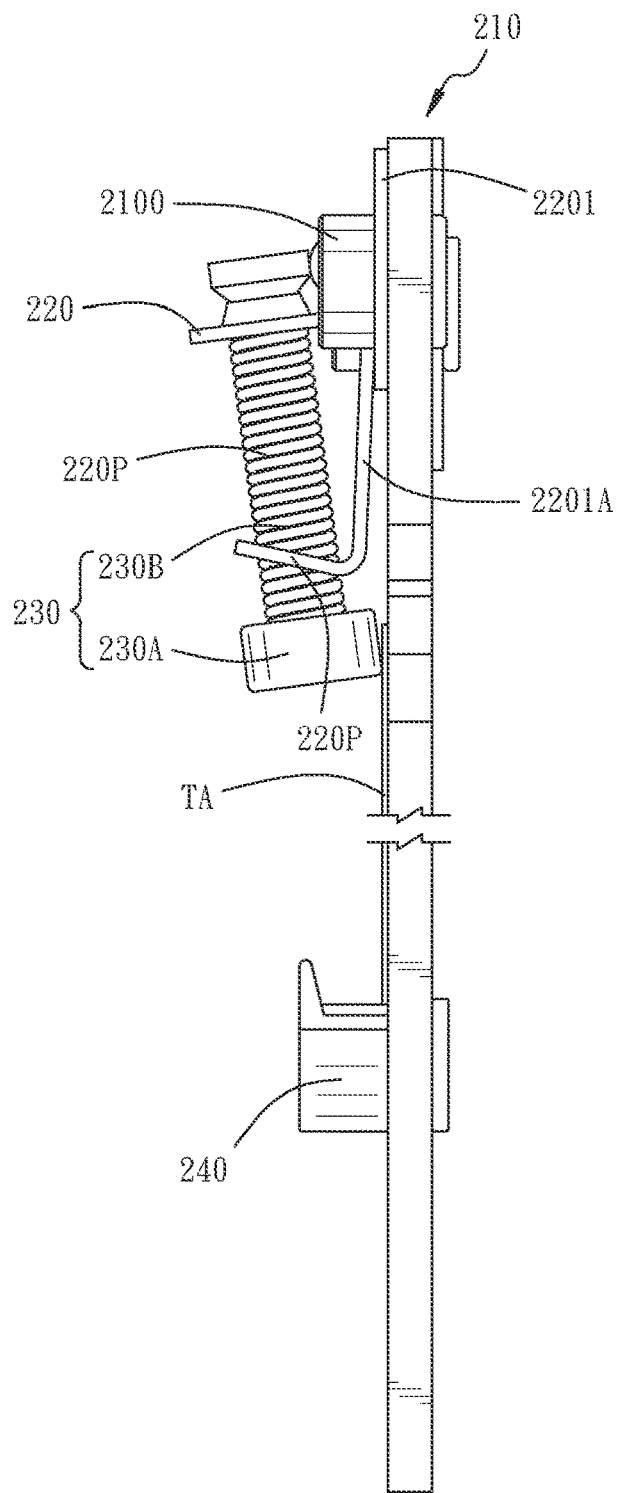
FIG. 6B is a side view of the vertical clamping substrate jig of the second embodiment of the present invention clamping the fragile flexible substrate.

Please refer to FIGS. 1B, 2B, 3B, 4B, 5B and 6B, where FIG. 1B is the schematic diagram of the second embodiment of the vertical clamping substrate jig of the present invention, FIG. 2B is the schematic diagram of the second embodiment of the fixing structure and clamping member of the present invention, FIG. 3B is a schematic diagram of placing the clamping end of the clamping member of the second embodiment of the present invention in the groove, FIG. 4B is a schematic diagram of the second embodiment of the present invention using a push rod to push the extended body part and then push the clamping member, FIG. 5B is a schematic diagram of the vertical clamping substrate jig of the second embodiment of the present invention clamping the fragile flexible substrate, and FIG. 6B is a side view of the vertical clamping substrate jig of the second embodiment of the present invention clamping the fragile flexible substrate. The vertical clamping substrate jig 200 comprises a jig body 210, a plurality of fixing structures 220, a plurality of clamping members 230, at least one supporting member 240 and a plurality of positioning members PT. The whole jig body 210 is made of non-metallic material The jig body 210 comprises an upper frame plate 212, a lower frame plate 214, a first side frame plate 216 and a second side frame plate 218. The first side frame plate 216 and the second side frame plate 218 are respectively connected to both ends of the upper frame plate 212 and the lower frame plate 214, so that the central portion 210A of the jig body 210 is hollow. The four corners of the central portion 210A each have a first arc-shaped groove 210B. The upper frame plate 212, the first side frame plate 216 and the second side frame plate 218 each have at least one through hole 210C. In addition, the lower frame plate 214 has at least one second arc-shaped groove 214A. In this second embodiment of the present invention, the lower frame plate 214 has two second arc-shaped grooves 214A. The fixing structures 220 are correspondingly disposed beside the through holes 210C, wherein the central body 2201 of the fixing structure 220 is connected to one end of the clamping member 230, and an extended body part 2201A of the central body 2201 covers the corresponding part of the through hole 210C. A spring piece ST is set on the central body 2201, and the spring piece ST can make the extended body part 2201A return to its original shape after being subjected to external force. The two ends of each fixing structure 220 have a stop portion 220P respectively.

Similarly, the fixing structures 220 are fixed with the upper frame plate 212, the first side frame plate 216 and the second side frame plate 218 through the corresponding locking member 2100. Both ends of the upper frame plate 212 have upper hanging portions 212A respectively. The outer extending sections of the first side frame plate 216 and the second side frame plate 218 have insertion portions 216B and 218B and lower hanging portions 216A and 218A, respectively. Each of the lower hanging portions 216A and 218A is formed on the outer side of each of the insertion portions 216B and 218B.

The clamping members 230 are respectively arranged on the upper frame plate 212, the first side frame plate 216 and the second side frame plate 218. One end of the clamping members 230 is respectively connected to the fixing structures 220 and the other end is the clamping end 230A. The middle section of the clamping members 230 is an elastic portion 230B. The clamping members 230 are mainly used to jointly clamp the vertical flexible substrate TA, and in this embodiment of the present invention, the thickness of the flexible substrate TA is 0.2 mm to 3 mm. Also, in this embodiment, the elastic portion 230B may be a spring. In this embodiment, the clamping ends 230A of the clamping members 230 are used to contact and clamp the flexible substrate TA, and the material of the clamping ends 230A is ceramic, metal alloy, quartz or glass. Furthermore, as shown in FIG. 4A, in the first embodiment, the flexible substrate TA can be pushed out through the through holes 210C by using the push rods 20 and pushing up a plurality of clamping members 230 to bend upwards (compared with the first embodiment, this embodiment is easier to push the clamping members 230), so that the flexible substrate TA can be placed on the vertical clamping substrate jig 200. After that, the push rods 20 exit the through holes 210C so that multiple clamping members 230 can clamp the flexible substrate TA, as shown in FIG. 5B. It is worth mentioning that, in order to in order to be able to instantly know whether the function of the spring piece ST is normal, the push rods 20 are equipped with a pressure sensor (not shown). When the push rod 20 pushes the extended body part 2201A in front of the through hole 210C, the pressure sensor will feel the recovery force of the spring piece ST to determine whether the spring force of the spring piece ST is normal. Once the pressure sensor senses that the elasticity of the spring piece ST is abnormal, it will notify the management personnel to replace it, so as to avoid the problem that the clamping members 230 cannot clamp the flexible substrate TA.

In addition, the above-mentioned supporting members 240 are locked through the locking members 2100 and arranged on the lower frame plate 214. The supporting members 240 are used to support the upright flexible substrate TA, as shown in FIG. 6B.

Next, the operation of the vertical clamping substrate jigs 100 and 200 according to the first and second embodiments of the present invention will be further described, wherein in the disclosure of the present invention, the second embodiment is a preferred embodiment.

Figure 7A:
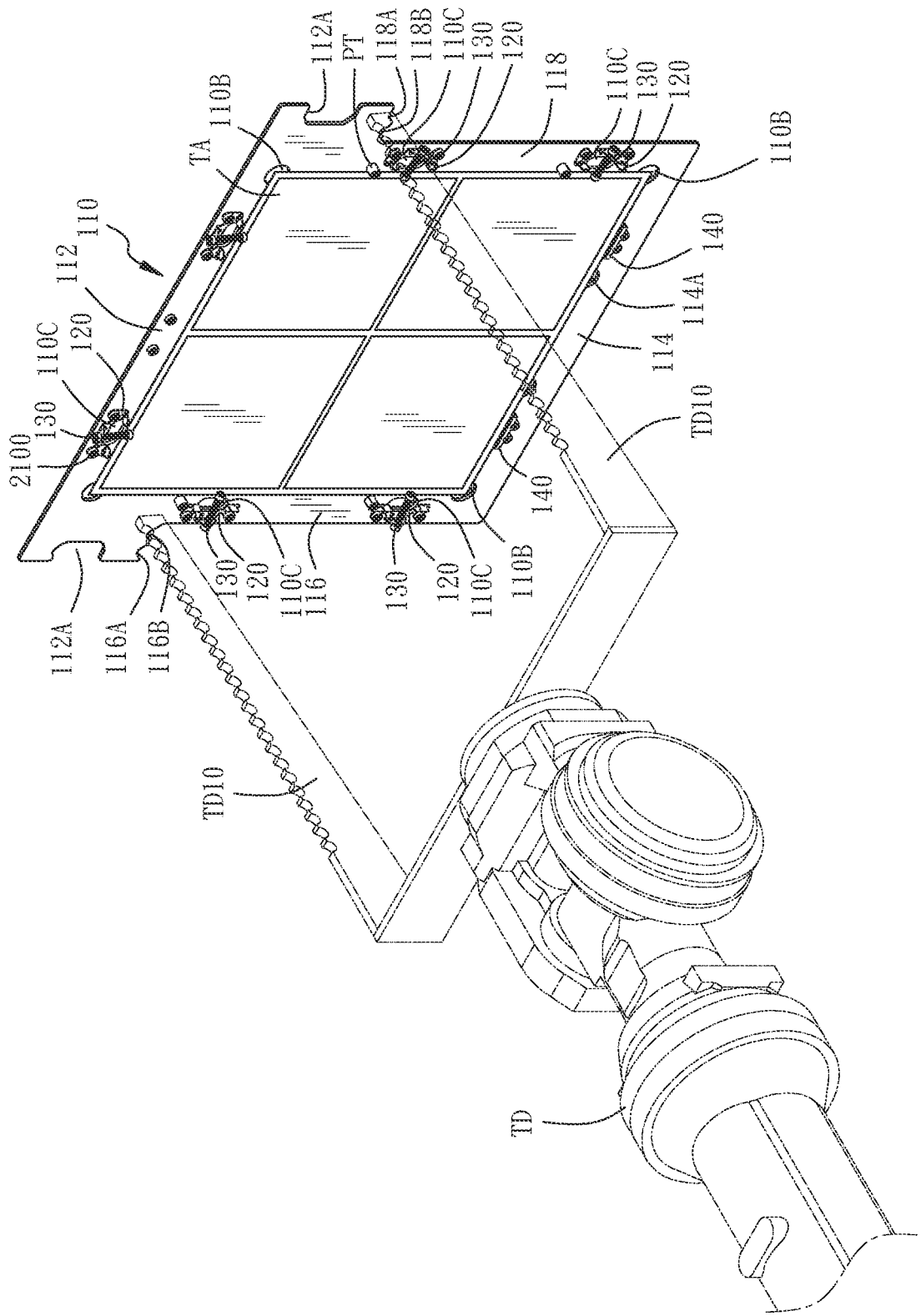
FIG. 7A is a schematic diagram of the tool end of the transfer device of the first embodiment of the present invention performing vertical transfer.
Figure 7B:
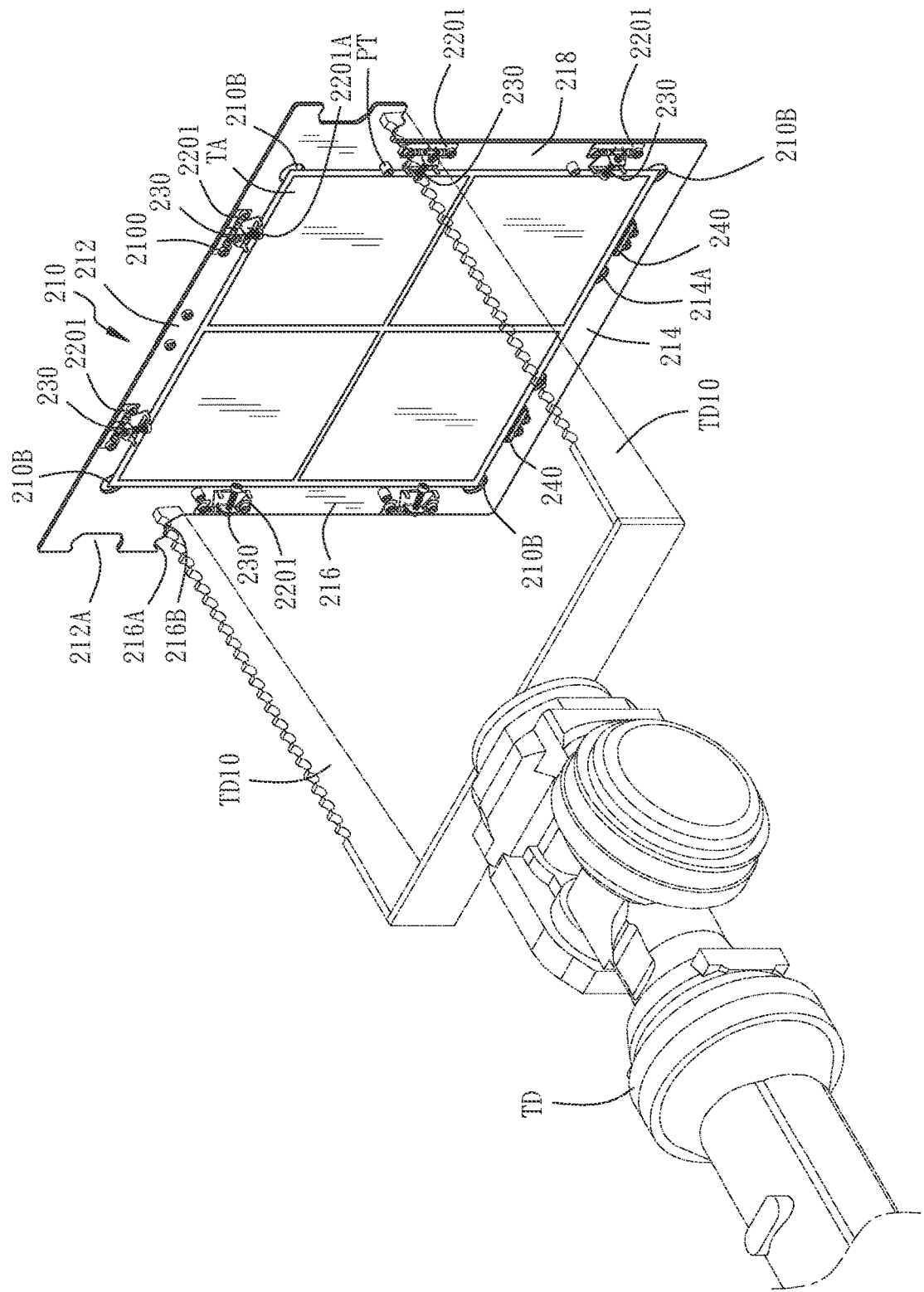
FIG. 7B is a schematic diagram of the tool end of the transfer device of the second embodiment of the present invention performing vertical transfer.

Please also refer to FIG. 7A And FIG. 7B, where FIG. 7A is a schematic diagram of the tool end of the transfer device of the first embodiment of the present invention performing vertical transfer, and FIG. 7B is a schematic diagram of the tool end of the transfer device of the second embodiment of the present invention performing vertical transfer. The main explanation below is how to move the flexible substrate TA with a thickness of 0.2 mm to 3 mm under the advanced process and send it to the oven for high temperature process or other placement, which not only solves the difficulty of transferring flexible substrate TA, but also solves the problem that flexible substrate TA will not be broken or deformed under high temperature process. First of all, the number of six is used as an example, but not limited to six. In this embodiment, there will be six push rods respectively passing through the six through holes 110C or 210C and pushing the six clamping members 130 or 230. Next, the fragile flexible substrate TA is clamped by the robot arm and entered through the second arc-shaped groove 114A or 214A and the flexible substrate TA is sent to the vertical clamping substrate jig 100 or 210 and the positioning is completed through the positioning members PT and the supporting members 140 or 240. After the positioning of the present embodiment is completed, the six push rods are respectively withdrawn from the six through holes 110C or 210C and the six clamping members 130 or 230 are clamped to the upright flexible substrate TA. At this time, the robot arm is exited from the second arc-shaped groove 114A or 214A. It should be noted that, in this embodiment, each of the four corners of the central portion 110A or 210A has the first arc-shaped grooves 110B or 210 B, which can prevent the four corners of the flexible substrate TA from hitting the vertical clamping substrate jig 100 or 200 when the flexible substrate TA is just positioned with the vertical clamping substrate jig 100 or 200.

Next, since one vertical clamping substrate jig 100 or 200 can only clamp one flexible substrate TA, the automated workflow will continue the above actions to sequentially transfer about 20-50 fragile flexible substrates TA to the respective vertical clamping substrate jigs 100 or 200. In the following content, 24 are used as an example (but not limited to 24). Once the transfer of the 24 flexible substrates TA to the vertical clamping substrate jigs 100 or 200 is completed, the tool end TD10 of the transfer device TD will perform a vertical transfer of the 24 vertical clamping substrate jigs 100 or 200.

Each of the insertion portions 116B (or 216B) and 118B (or 218B) is used for the tool end TD10 of the transfer device TD to be inserted and mounted to transport multiple flexible substrates TA, as shown in FIG. 7A or 7B (FIG. 7A or 7B only draws one as an example for easy viewing).

To sum up, the vertical clamping substrate jig disclosed by the present invention can achieve the following effects:
1. Place and handle the fragile flexible substrate in vertical to avoid cracking or deformation.
2. Use material with substantially the same expansion and thermal conductivity as the flexible substrate to avoid cracking or deformation during high temperature process.
3. Under the advanced process, the fragile flexible substrate can be transferred in batches and the baking and heating process can be performed.

The above descriptions are only preferred embodiments of the present invention, and are not intended to limit the scope of the present invention. Therefore, all equivalent changes or modifications based on the features and spirit described in the scope of the application of the present invention shall be included in the scope of the patent application of the present invention.

What the invention claimed is:

1. A vertical clamping substrate jig for vertically clamping a fragile flexible substrate having a thickness in between 0.2 mm to 3 mm and transferring said flexible substrate in vertical through a tool end of a transfer device, the vertical clamping substrate jig comprising:
    a jig body comprising an upper frame plate, a lower frame plate, a first side frame plate and a second side frame plate, said first side frame plate and said second side frame plate being respectively connected to both ends of said upper frame plate and said lower frame plate, so that a central portion of said jig body is hollow, each of four corners of said central portion being provided with a first arc-shaped groove, said upper frame plate, said first side frame plate and said second side frame plate each having at least one through hole;
    a plurality of fixing structures correspondingly disposed beside said through holes, each said fixing structure having two ends thereof respectively provided with a stop portion;
    a plurality of clamping members respectively arranged on said upper frame plate, said first side frame plate and said second side frame plate, each said clamping member having one end thereof connected to one respective said fixing structure, an opposite end thereof terminating in a clamping end and an elastic portion on the middle between the two ends, said clamping members being used to jointly clamp said flexible substrate in vertical; and
    at least one supporting member respectively disposed on said lower frame plate through one respective locking member, said at least one supporting member being used to support said fragile flexible substrate in vertical.

2. The vertical clamping substrate jig as claimed in claim 1, wherein said through holes are respectively for a respective push rod to pass through said through holes and push said clamping members.

3. The vertical clamping substrate jig as claimed in claim 1, wherein said fixing structures are fixed with said upper frame plate, said first side frame plate and said second side frame plate through the corresponding locking members.

4. The vertical clamping substrate jig as claimed in claim 1, wherein said central body of each said fixing structure is connected to the corresponding said clamping member, and said central body of each said fixing structure is beyond the corresponding said through hole.

5. The vertical clamping substrate jig as claimed in claim 1, wherein said central body of each said fixing structure is connected with the corresponding said clamping member, and an extended body part of said central body of each said fixing structure covers the corresponding part of the corresponding said through hole, and a spring piece is set on said central body of each said fixing structure, and said spring piece makes the extended body part of said central body of the respective said fixing structure return to the original shape after being subjected to external force.

6. The vertical clamping substrate jig as claimed in claim 1, wherein said clamping ends of said clamping members are used to contact and clamp said fragile flexible substrate, and the material of said clamping ends is selectively ceramic, metal alloy, quartz or glass.

7. The vertical clamping substrate jig as claimed in claim 1, wherein both ends of said upper frame plate have a respective upper hanging portion.

8. The vertical clamping substrate jig as claimed in claim 1, wherein said first side frame plate and said second side frame plate each have an outer extending section provided with an insertion portion and a lower hanging portion, each of said lower hanging portions being formed outside the respective said insertion portion.

9. The vertical clamping substrate jig as claimed in claim 8, wherein each said insertion portion is inserted and hung by the tool end of the transfer device to transport said fragile flexible substrate.

10. The vertical clamping substrate jig as claimed in claim 1, wherein said lower frame plate has at least one second arc-shaped groove.

11. The vertical clamping substrate jig as claimed in claim 1, further comprising a plurality of positioning members arranged on said first side frame plate and said second side frame plate.

\* \* \* \* \*